United States Patent
Oehler et al.

(10) Patent No.: US 8,664,936 B2
(45) Date of Patent: Mar. 4, 2014

(54) ELECTRONIC MOTOR VEHICLE CONTROL SYSTEM WITH CURRENT MEASURING CIRCUIT

(75) Inventors: Peter Oehler, Frankfurt (DE); Frank Michel, Rosbach v.d. Hohe (DE); Micha Heinz, Darmstadt (DE); Axel Schmitz, Hattersheim (DE)

(73) Assignee: Continental Teves AG & Co. oHG (DE)

( * ) Notice: Subject to any disclaimer, the term of this patent is extended or adjusted under 35 U.S.C. 154(b) by 718 days.

(21) Appl. No.: 12/934,350

(22) PCT Filed: Mar. 25, 2009

(86) PCT No.: PCT/EP2009/053537
§ 371 (c)(1),
(2), (4) Date: Nov. 19, 2010

(87) PCT Pub. No.: WO2009/118351
PCT Pub. Date: Oct. 1, 2009

(65) Prior Publication Data
US 2011/0057644 A1    Mar. 10, 2011

(30) Foreign Application Priority Data
Mar. 27, 2008 (DE) .......................... 10 2008 015 841

(51) Int. Cl.
  *G01R 19/18* (2006.01)
  *G06F 7/00* (2006.01)
(52) U.S. Cl.
  USPC ............ 324/120; 324/118; 324/125; 701/36; 701/70
(58) Field of Classification Search
  None
  See application file for complete search history.

(56) References Cited

U.S. PATENT DOCUMENTS

| | | | |
|---|---|---|---|
| 2004/0078132 A1* | 4/2004 | Fey et al. | .................. 701/70 |
| 2006/0004898 A1 | 1/2006 | Meier et al. | |
| 2009/0299592 A1 | 12/2009 | Oehler et al. | |

FOREIGN PATENT DOCUMENTS

| | | |
|---|---|---|
| DE | 100 18 650 A1 | 12/2000 |
| DE | 10 2007 001 458 A1 | 9/2007 |
| WO | WO 2004/030211 A2 | 4/2004 |
| WO | WO 2004/030211 A3 | 4/2004 |
| WO | WO 2007/131947 | 11/2007 |

OTHER PUBLICATIONS

Axel Mertens et al.: "Voltage and Current Sensing in Power Electronic Converters Using Sigma-Delta A/D Conversion", IEEE Transactions on Industry Application, IEEE Service Center, Piscataway, NJ , BD. 34, NR. 5, Oct. 1, 1998 XP011022452, ISSN: 0093-9994.

\* cited by examiner

*Primary Examiner* — Minh N Tang
(74) *Attorney, Agent, or Firm* — RatnerPrestia

(57) ABSTRACT

The invention relates to an electronic motor vehicle control system having at least one valve actuating circuit which controls a load current by means of pulse width modulation. The actuating circuit has at least one electronic current measuring circuit which has at least one measurement path with at least one analog/digital converter. The analog/digital converts an analog measurement signal of the load current into a digital measurement signal of the load current and is actuated or designed in such a way as to carry out a plurality of current measurements per PWM period. The at least one measurement path of the current measurement circuit has a signal conservation circuit which provides the analog measurement signal of the load current substantially unchanged, and independent of the actual load current, for at least a defined hold time ($t_{off->on}$, $t_{on->off}$).

24 Claims, 7 Drawing Sheets

ELECTRONIC MOTOR VEHICLE CONTROL SYSTEM WITH CURRENT MEASURING CIRCUIT

CROSS REFERENCE TO RELATED APPLICATIONS

This application is the U.S. national phase application of PCT International Phase Application No. PCT/EP2009/053537, filed Mar. 25, 2009, which claims priority to German Patent application No. 102008015841.0, filed Mar. 27, 2008, the contents of such application being incorporated by reference herein.

FIELD OF THE INVENTION

The invention relates to an electronic motor vehicle control system, to a method for current measurement, and to the use of the electronic motor vehicle control system in motor vehicle brake systems.

BACKGROUND OF THE INVENTION

In documents DE 100 57 486 A1, which is incorporated herein by reference, and DE 10 2007 001 458 A1, which is incorporated herein by reference, valve actuation circuits in electronic controllers for motor vehicle brake systems are proposed which use pulse width modulation (PWM) to control the load current flowing through an essentially inductive load. The actuation circuit has an electronic current measuring circuit with a switch-on path and a recirculation path, these two measurement paths respectively comprising a sigma/delta modulator.

SUMMARY OF THE INVENTION

It is an object of the present invention to propose an electronic motor vehicle control system and a method for current measurement within an electronic motor vehicle control system with PWM current regulation which can be used to perform a current measurement with a higher level of accuracy in comparison with existing circuits.

The invention achieves this object by means of the electronic motor vehicle control system and the method described herein.

The invention relates to the concept that it may be advantageous to hold or store the measured analog current signal for the load current for a particular time without current measurement being performed in this hold or storage time or the currently measured current being taken into account in the output to further circuit parts. After the hold time, the current measurement is continued or taken into account again.

A measurement signal for the load current flowing through the preferably essentially inductive load is understood to mean a signal which is dependent on the load current and which may be produced by scaling the load current, for example using a sense FET, and/or which may be a voltage signal which can be tapped off across a shunt which carries the load current. This term may cover signals which map the time profile of a measured variable for the load current or which are dependent on the load current in respect of at least one variable. Alternatively, the aforementioned term may also cover the load current signal per se or another signal which is dependent on the load current and which is provided for the purpose of measuring the load current.

A valve actuation circuit is preferably understood to mean a circuit which controls at least the current through a valve, possibly a hydraulic valve, which is an essentially inductive electrical load. In this context, the valve actuation circuit uses pulse width modulation and has at least one switch-on path with a power driver and a recirculation path with a power driver. With particular preference, a valve actuation circuit is understood to mean a PWM output stage.

The formal error is understood to mean the discrepancy between the actual average or RMS value of the load current and the averaged measured value, obtained on the basis of the respective method of current measurement, over the load current.

The analog/digital converter is preferably in the form of a sigma/delta modulator. In this case, the electronic current measuring circuit performs current measurement for the load current by oversampling the analog measurement signal for the load current, which involves the clock rate of the respective sigma/delta modulator being significantly higher than the frequency of the pulse width modulation.

The use of a sigma/delta modulator firstly has the advantage that a load current can be measured by oversampling an analog measurement signal for the load current, as a result of which a plurality of current values per PWM period are captured and hence formal errors can be reduced or avoided. Secondly, sigma/delta modulators are relatively inexpensive because their resolution is dependent not only on the order but also primarily on the clock rate at which they are operated and hence low-order modulators can also be used. It is thus preferred to use at least one 1-bit sigma/delta modulator for current measurement which requires particularly few semiconductor elements, is therefore inexpensive and can nevertheless achieve a high resolution by means of the clock rate. On account of the fact that such an analog/digital, converter is relatively inexpensive, it is expediently possible to use at least one of these in each current measuring circuit, particularly a respective one per PWM path, which renders complex and hence relatively expensive priority logic for the actuation of an individual analog/digital converter by all the current measuring circuits contained in the motor vehicle control system superfluous. The current measurement by the sigma/delta modulator may be effected directly, that is to say without converting the current into a corresponding voltage.

The at least one electronic current measuring circuit is preferably integrated in the at least one valve actuation circuit or is comprised by the latter.

The at least one electronic current measuring circuit may be be in the form of an integrated circuit and may be integrated in the electronic motor vehicle control system, which is also in the form of an integrated circuit.

The valve actuation circuit is preferably designed or operated such that the edges of the load current have relatively low gradients, particularly a gradient of less than 5 A/µs, particularly preferably of less than 3 A/µs, for the changeover operations between the PWM phases so that the emission of particularly high-frequency electromagnetic radiation is kept relatively low.

The signal conservation circuit preferably comprises an electronic memory element, such as a capacitor, which may be used to store an electrical signal representing the present current for a temporary time.

According to one embodiment, the signal conservation circuit (respectively) has an input switch and an output switch which are provided by driver circuits, for example, wherein the input switch can be used to isolate the signal conservation circuit from the load current or a direct or indirect load current signal by opening this switch and hence the analog measurement signals may be kept essentially unchanged. The output switch may be used to isolate the signal conservation circuit from the respective analog/digital converter by opening this switch.

The at least one measurement path for the electronic current measuring circuit preferably comprises an input circuit which has at least one sense FET, particularly a sense amplifier, which provides the analog measurement signal for the load current on the basis of the load current.

The electronic current measuring circuit may have at least one switch-on path and/or at least one recirculation path as measurement paths, wherein at least one or both respectively comprise at least one analog/digital converter. In this case, it is particularly expedient if each measurement path comprises a dedicated signal conservation circuit.

The at least one valve actuation circuit may comprise either only one switch-on path, in which the recirculation flows via a freewheeling diode, or an active switch-on path and an active recirculation path, particularly with at least one respective power driver for switching this path on and off.

It is preferred for the switch-on path and/or the recirculation path of the current measuring circuit to have a respective input circuit which is/are actuated such that the input circuit for the switch-on path provides the actual load current directly or indirectly for this measurement path essentially only during or during a portion of the switched-on phase (or depending on the embodiment, only during or during a portion of the switched-off phase).

In accordance with a first embodiment, both the switch-on path and the switch-off path contain the current measuring devices described above. In this case, the signal conservation circuit is expediently activated whenever the switched-on phase is changed over to the recirculation phase, wherein the current is held for a defined hold time or until the voltage across the at least one power driver, particularly the switch-on driver or recirculation driver, of the valve actuation circuit has settled in a defined manner or a defined threshold voltage has been exceeded or undershot. During the conservation phase, the output current is kept essentially unchanged and provided for further processing (current measurement).

According to a second embodiment, which is significantly more cost-saving, the input circuit provides the actual (instantaneous) current for the switch-on path or for the recirculation path only for a prescribed period of time which expediently starts essentially at the beginning of each PWM period, wherein accurately speaking this does not start until the current measurement signal has settled. The hold phase, in which the conservation circuit outputs the most recently stored current measurement value, may begin at a prescribed time which is between some time after the beginning of the PWM period and some time before the expiry of the switched-on phase. Particularly preferably, the current in the switch-on path is measured and forwarded from the beginning (or shortly thereafter) of each PWM period. In this context, the starting time for the hold phase is determined by a suitable time base. The time base is either the PWM period or the duty cycle or derived therefrom. With particular preference, the time base used is both the PWM period and the duty cycle. The starting time is preferably in a range between approximately 5 and 80 percent of the duty cycle of the PWM. Quite particularly preferably, the time is in a range between approximately 16 and 40 percent in line with a duty cycle of the PWM. The following is then true:

$$\text{Duty cycle} = \frac{t_i}{T},$$

wherein $t_i$ is the pulse duration and T is the period duration. It has been found that a range of between approximately 26 and 30 percent is most advantageous for the duty cycle. If the time of the beginning of the hold phase is stipulated as described above, the formal error defined below is astonishingly small even under changing constraints (different loads and ambient conditions).

In the second embodiment, the hold phase ends after the expiry of the entire PWM period (after a switched-on and recirculation phase). The error produced by the missing measurement during a portion of the switched-on phase and the entire switched-off phase is thus advantageously averaged out of the measurement result.

The input circuits of the switch-on path and/or of the recirculation path each have at least one sense FET, such as a sense amplifier, which provides the analog measurement signal for the load current on the basis of the actual load current. In this case, the gate connection of this at least one sense FET may be connected to the gate connection of at least one power driver of the switch-on path or of the recirculation path. In addition, the drain connections and/or the source connections of the respective sense FET and of the respective power driver are connected or coupled to one another directly or indirectly. This design of the electronic current measuring circuit allows indirect current measurement, with the current which is actually to be measured turning out to be smaller by a defined factor, which allows the measuring components to be designed not necessarily for power applications, or such a design is required only to a correspondingly lower degree.

It is expedient for the at least one sigma/delta modulator to comprise, a control loop which has an integrator element, such as an integrator, a capacitor or another component or an electronic circuit with a corresponding electrical response, a comparator and a controllable, switchable current source. This switchable current source may be designed such that it can drive various discrete current values and can be switched between these various current values. This switchable current source may comprise a parallel circuit of current sources, the currents of which can be added in a defined manner and this process may be switchable.

It is preferred for the at least one analog/digital converter to comprise at least one memory element, which can store at least one information item about the analog measurement signal for the load current directly or indirectly, and at least in the first embodiment at least one switch, wherein this switch can be used to isolate the memory element, possibly electrically, and possibly to deactivate the analog/digital converter. In particular, the memory element is a capacitor or a capacitance or an integrator element in a sigma/delta modulator, and the switch switches the switchable current source for this sigma/delta modulator.

The output of the at least one sigma/delta modulator may be connected to at least one averaging device. This averaging device may be counter element or a "moving average filter" or alternatively an exponentially weighted moving average filter, which behaves as a first-order digital low-pass filter. The counter element may be a circuit which is designed or actuated such that it sums digital data. Such a counter or such a counter element implicitly performs averaging, since all the data from the sigma/delta modulator are summed and hence taken into account by the latter for each clock cycle.

It is expedient that the electronic current measuring circuit has a changeover unit or a multiplexer and a common averaging device, wherein the outputs of the switch-on path and of the recirculation path are connected to the inputs of the changeover unit, and the output of the changeover unit is connected to the input of the common averaging device.

The invention also relates to a method.

In line with a first embodiment of the method, the load current is expediently measured during a switched-on phase and a recirculation phase of the PWM, wherein the electronic current measuring circuit to this end has at least one switch-on path and at least one recirculation path as measurement paths which respectively comprise at least one analog/digital converter and a signal conservation circuit.

This method may be complemented in that the changeover between the PWM phases involves an input switch of the signal conservation circuit of the measurement path which is associated with the PWM phase just finished being opened, as a result of which the analog measurement signal for the load current in this PWM path is provided in unaltered form essentially for a defined hold time, wherein this defined hold time is followed by an output switch of this signal conservation circuit being opened, as a result of which the A/D converter is frozen, and hence the measurement signal or an electrical variable which is dependent thereon being stored directly or indirectly for the duration of the PWM phase just begun plus the hold time which follows this PWM phase. In line with a second embodiment of the method, the load current is determined only during a portion of the switched-on and/or switched-off phase. This current measurement may take place only during the switched-on phase. Expediently, the current measurement is started at the beginning of each PWM period or in each suitable PWM period. The method according to the second embodiment can be applied in driver circuits in which only the actuation path comprises an active component, especially since the method according to the first embodiment admits current measurement in the recirculation phase only little—if at all. The absence of one or more active semiconductor elements in the recirculation path means that such an actuation circuit affords cost advantages.

The hold phase which follows the current measurement phase in the second embodiment may begin at a duty cycle of the PWM which is in a range between approximately 5 and 80 percent.

In the second embodiment, the hold phase preferably ends in the region of the end of the PWM period (after the recirculation phase).

In the first embodiment, the hold phase (phase of the measurement signal) does not begin until in the region of the transition from the switched-on phase to the switched-off phase or vice versa (phases of the actuation), the exact time expediently being dependent upon or determined by the elapsing of a defined or determined settling time after the switching, particularly until the voltage across the respective power driver of the switch-on path or of the recirculation path has settled. The time for the duration of the hold phase (hold time) may be dependent on the drop in this respective voltage below a defined threshold voltage. A drop below or rise above this threshold voltage prompts actuation of the electronic current measuring circuit such that the hold phase is finished. Alternatively, the hold time is obtained from the rise above a defined voltage threshold by the gate or base voltage of the respective power driver in the switch-on or recirculation path. The hold time comprises an additional settling time for the input circuit of the respective PWM path. The time of the hold phase is essentially equally long for the transitions from recirculation phase to switched-on phase and switched-on phase to recirculation phase or is alternatively of different length.

The hold time for the first embodiment may be obtained in total from the time interval beginning with the changeover time for the PWM and ending with a drop below or rise above a defined voltage threshold on the respective line driver or one of the line drivers of the valve actuation circuit and a time interval which is defined by a defined settling time for the at least one measurement path. Alternatively, the hold time may be set essentially permanently by the timing behavior of the current measuring circuit and/or the valve actuation circuit in a defined manner, in line with the aspects explained above.

In the first embodiment, it is expedient that the respective changeover between the PWM phases involves, directly at the beginning of a respective PWM phase, the input switch of the signal conservation circuit of the respective PWM path being closed and the output switch of this signal conservation circuit of the one PWM path respectively being closed essentially when the output switch of the signal conservation circuit of the other PWM path is opened.

In this case, it is preferred that in each case essentially at the same time as the output switch of the signal conservation circuit of one of the measurement paths is opened, a switch of the analog/digital converter of this measurement path is likewise opened and hence a memory element of this analog/digital converter is isolated and particularly this analog/digital converter is deactivated, wherein this switch of this analog/digital converter is also closed again or becomes additionally actuatable again essentially at the same time as the output switch of the signal conservation circuit of this measurement path, as a result of which this analog/digital converter is reactivated. The temporary connection and disconnection of the analog/digital converter prevents undesirable signal elements of the digital measurement signal for the load current from being produced. The temporary isolation of the memory element of the analog/digital converter by means of its switch means that during an inactive phase of the respective measurement path a change in the information stored directly or indirectly in the memory element, which is in the form of an integrator for a sigma/delta modulator, and may be kept essentially unchanged.

The digital measurement signals from the PWM paths are preferably transmitted to a common evaluation circuit or are taken into account by the latter essentially within the time interval in which the output switch of the signal conservation circuit of the respective PWM path is closed, wherein the output signal from this common evaluation circuit contains at least the information about the amplitude of the measured load current, particularly for a respective PWM period. The common evaluation circuit comprises a common averaging device, which is in the form of a counter, for example. By contrast, in the second embodiment, the output switch can be dispensed with, since the sigma/delta converter runs permanently in parallel.

The invention also relates to the use of the electronic motor vehicle control system in a motor vehicle brake system.

The electronic motor vehicle control system according to aspects of the invention and the method according to the aspects of the invention are preferably used in electronic motor vehicle brake systems, in which electromagnetic hydraulic valves are actuated by means of pulse width modulation in valve actuation circuits, to set the hydraulic pressure in wheel brakes of the motor vehicle. Alternatively, there is provision for them to be used in a servo-assisted steering system in a motor vehicle, wherein the electronic motor vehicle control system according to aspects of the invention actuates the at least one hydraulic valve.

Further embodiments can be found in the description of exemplary embodiments below with reference to figures.

BRIEF DESCRIPTION OF THE DRAWINGS

The invention is best understood from the following detailed description when read in connection with the accompanying drawings. Included in the drawings is the following figures.

DETAILED DESCRIPTION OF THE PREFERRED EMBODIMENTS

Figure 1:
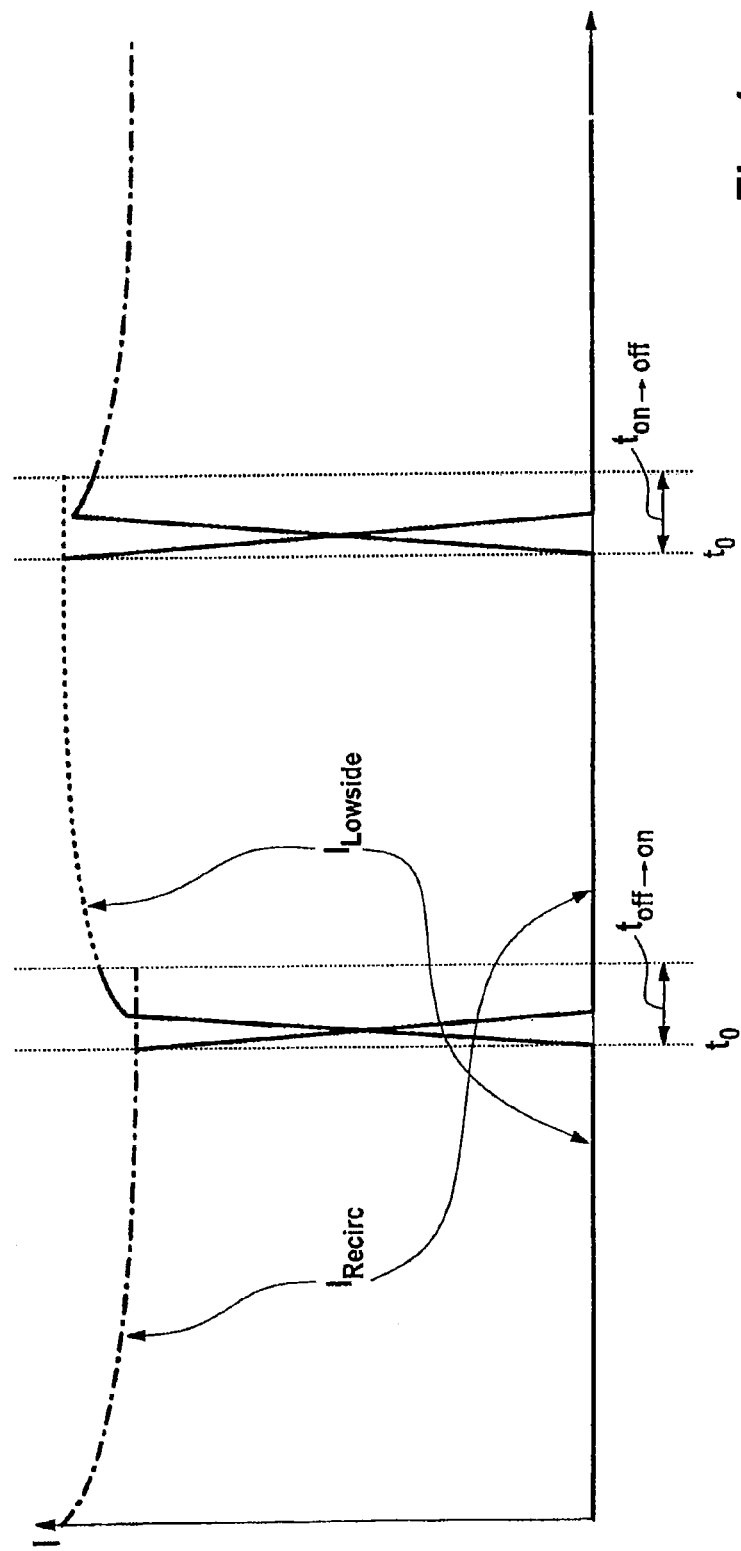
FIG. 1 shows an exemplary embodiment of a current profile for a circuit with lowside and recirculation drivers in a valve actuation circuit.

FIG. 1 shows an exemplary embodiment of a typical current profile through the lowside driver or through the recirculation driver of a valve actuation circuit, that is to say in line with the power driver of the switch-on and recirculation paths of a valve actuation circuit. In this case, this current essentially corresponds to the load current through the valve coil or is dependent thereon. The current profiles of $I_{Recirc}$ and $I_{Lowside}$ correspond to the currents to be measured in the recirculation phase and in the switched-on phase. At time $t_0$, these two PWM phases are respectively changed over. In this context, it can be seen from the figure that in the transition phases $t_{off \rightarrow on}$ and $t_{on \rightarrow off}$, in which the valve circuit is still in an unsettled state, the respective currents are significantly below an average current, which can lead to undesirable measurement results. For this reason, in line with the example, the respective current in the path just disconnected is kept unchanged or constant by a signal conservation circuit for a defined hold time which corresponds to the duration of the transition phases $t_{off \rightarrow on}$ and $t_{on \rightarrow off}$. This allows the average value of the current through a plurality of measurement points to be ascertained relatively precisely per PWM phase. The currents kept unchanged are illustrated by the dotted or dash-dot sections within the transition phases $t_{off \rightarrow on}$, $t_{on \rightarrow off}$. The analog measurement current which is measured overall in continuous measurements is marked by the dotted or dash-dot profile over all the sections of the graph. In line with the example, the end of the transition phases is defined by virtue of the voltage across the respective line driver of the switch-on path or recirculation path of the valve actuation circuit being settled or a defined threshold voltage being undershot and additionally a defined settling time for the measurement path having passed. It has been found and is evident from FIG. 1 that the "measurement error" still made in line with the example within the transition phases is alternately positive and negative and the differential error therefore becomes very small if the duration of the transition phases is very much shorter than the period duration of the PWM. This practice thus advantageously also allows precise measurements to be performed when they are close in time to changeover operations between the two PWM phases.

Figure 2:
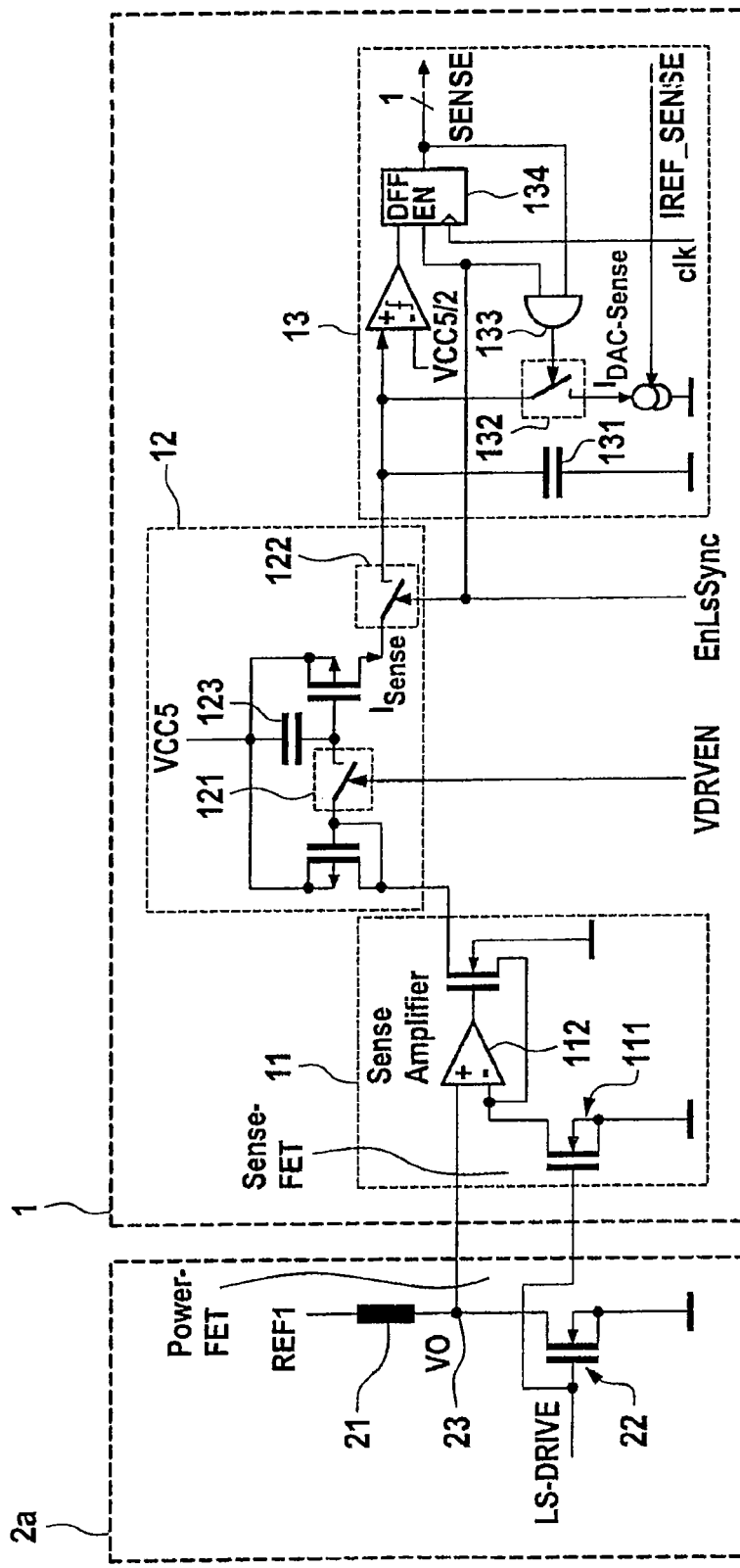
FIG. 2 shows a switch-on path in an electronic current measuring circuit.

FIG. 2 shows an exemplary switch-on path 1, as a measurement path in an electronic current measuring circuit, and also the switch-on path 2a of a valve actuation circuit in line with the example. This switch-on path 2a of the valve actuation circuit comprises inductive load or coil 21 for the valve, and a power driver 22 for the switch-on path. Supply potential REF1 is firstly applied to coil 21, and the potential VO is secondly applied to the node 23 between the coil 21 and the power driver 22. The gate connection of the power driver 22 has the signal LS-DRIVE applied to it, said signal turning on the power driver 22 when the switch-on path is activated. The switch-on path 1 of the current measuring circuit comprises an input circuit 11 with a sense amplifier 112 and a sense FET 111, a signal conservation circuit 12 with an input switch 121, an output switch 122 and a capacitance 123, and also a sigma/delta modulator 13. In line with the example, power driver 22 with gate input LS-DRIVE and input switch 121 with switching signal VDRVEN are actuated simultaneously, particularly at the same time as the signal EnLsSync described further below. As a result, the signal conservation circuit 12 is supplied with the analog measurement signal for the load current by the input circuit 11 from the beginning of a switched-on phase to the end of said switched-on phase. During the changeover from the switched-on phase to the recirculation phase, the input switch 121 is opened and the capacitance 123 stores the state of the analog measurement signal for the load current, as recently provided by the input circuit 11, and forwards said measurement signal essentially in unchanged form to the sigma/delta modulator 13 for a defined hold time. A sigma/delta modulator 13, which in line with the example is in the form of a control loop, comprises a capacitor 131 as an integrator element or integrator. In this case, the capacitor 131 serves as a memory element which provides at least one information item about the analog measurement signal for the load current which was recently provided for the sigma/delta modulator 13. The respective opening of the output switch 122 of the signal conservation circuit and the switch 132 of the sigma/delta modulator electrically isolates the memory element or capacitor 131. In this case, the switch 132 simultaneously serves as a switch of a regulatable current source of the sigma/delta modulator 13. The signal EnLsSync is used to prompt the switch 132 to open at the same time as the output switch 122 at the end of the hold time for a defined period. The signal conservation circuit 12 and the capacitor or memory element 131 respectively store the present, most recently provided state of the analog measurement signal for the load current. In this case, the signal conservation circuit 12 stores this last state of the analog measurement signal, in line with the example, until the beginning of the next switched-on phase, and the capacitor 131 stores it until the end of the defined hold phase, which follows the beginning of the next switched-on phase. The signal EnLsSync again prompts the output switch 122 to be closed and prompts the switch 132 to be enabled when the relevant output switch of the signal conservation circuit in the recirculation path is opened. The AND gate 133, the input side of which is connected to the switching signal EnLsSync and the output SENSE of the sigma/delta modulator 13, is used to actuate the output side of the switch 132. If the signal EnLsSync corresponds to a logic "0", the switch 132 is open and cannot freely change over the current source of the sigma/delta modulator by means of the digital measurement signal for the load current SENSE, which means that the sigma/delta modulator 13 is deactivated. If the signal EnLsSync corresponds to a logic "1", the output switch 122 is closed and the switch 132 is not constantly open, the switch 132 in this case being freely switchable or actuated on the basis of the digital measurement signal SENSE. The signal EnLsSync is in this case additionally applied to the "set" input of a D-type flip-flop 134 of the sigma/delta modulator 13, as a result of which the sigma/delta modulator 13 can additionally be deactivated when the signal EnLsSync is at a logic "0". Operation of the circuit is alternatively also possible without this signal line. In line with the example, the sigma/delta modulator 13 is operated at a much higher clock frequency clk than the frequency of the PWM.

Figure 3:
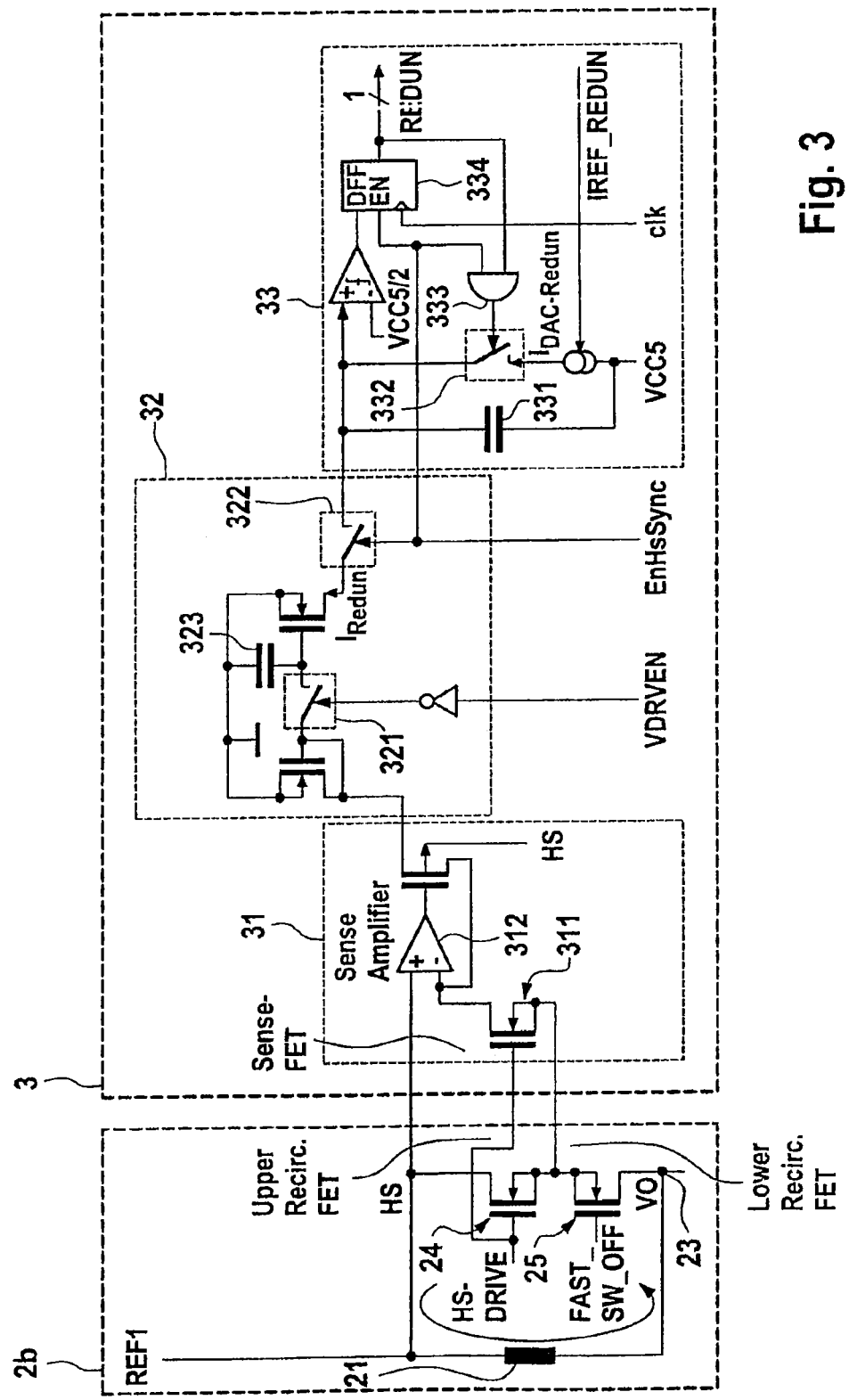
FIG. 3 shows a corresponding recirculation path for the current measuring circuit.

FIG. 3 shows the exemplary recirculation path 3, as a measurement path in an electronic current measuring circuit, and the recirculation path 2b of a valve actuation circuit based on the example. The recirculation path 2b of the valve actuation circuit has coil 21 of the valve, the power driver of the recirculation path 24, the gate side of which is actuated by the signal HS-DRIVE, node 23 at potential VO and an additional power driver 25 for rapid disconnection. By way of example, the hold time is determined by considering the voltage across the power driver 24 or the drop in said voltage below a defined threshold voltage or the rise above a defined threshold voltage for HS-DRIVE. The hold time accordingly lasts from the switch-on time of the power driver 24 until the signals explained above drop below or rise above the threshold voltages explained above, with it additionally being necessary to wait a defined settling time for the measurement path. The recirculation path 3 of the current measuring circuit likewise comprises an input circuit 31 with a sense amplifier 312 and sense FET 311, a signal conservation circuit 32 with an input switch 321, an output switch 322 and a capacitance 323, and a sigma/delta modulator 33 with a digital measurement signal for the load current REDUN as output signal. The input circuit 31 provides the analog measurement signal for the load current. The input switch 321 is actuated by the inverted signal VDRVEN and is therefore open and closed alternately with respect to input switch 121 from FIG. 2. When input switch 321 is closed, the analog measurement signal for the load current is provided in essentially unchanged form for the purpose of measurement by the sigma/delta modulator 33. When the recirculation phase is changed over to the switched-on phase, the output switch 322 and the switch 332 of the sigma/delta modulator 33 are opened when prompted by a logic "0" of the signal EnHsSync and are kept constantly open for a defined duration by means of the AND gate 333, the input side of which has the signal EnHsSync and the digital output signal REDUN from the sigma/delta modulator 33 applied to it and the output side of which actuates the switch 332. In this case too, the signal EnHsSync can preferably be actuated at the same time as the signal VDRVEN. As a result of the switchable current source of the sigma/delta modulator 33 not being freely switchable or switch 332 being able to be closed and because the signal EnHsSync is additionally applied to the "set input" of a D-type flip-flop 334 of the sigma/delta modulator 33, the sigma/delta modulator 33 is deactivated through a "0" of the signal EnHsSync and stops the current measurement until the signal EnHsSync corresponds to a logic "1" again in the next recirculation phase at the end of the hold phase of the switch-on path and the output switch 322 of the current measuring circuit is therefore closed again, the switch 332 is freely switchable again on the basis of the signal REDUN and there is a "1" again at the "set" input of the D-type flip-flop 334.

Figure 4:
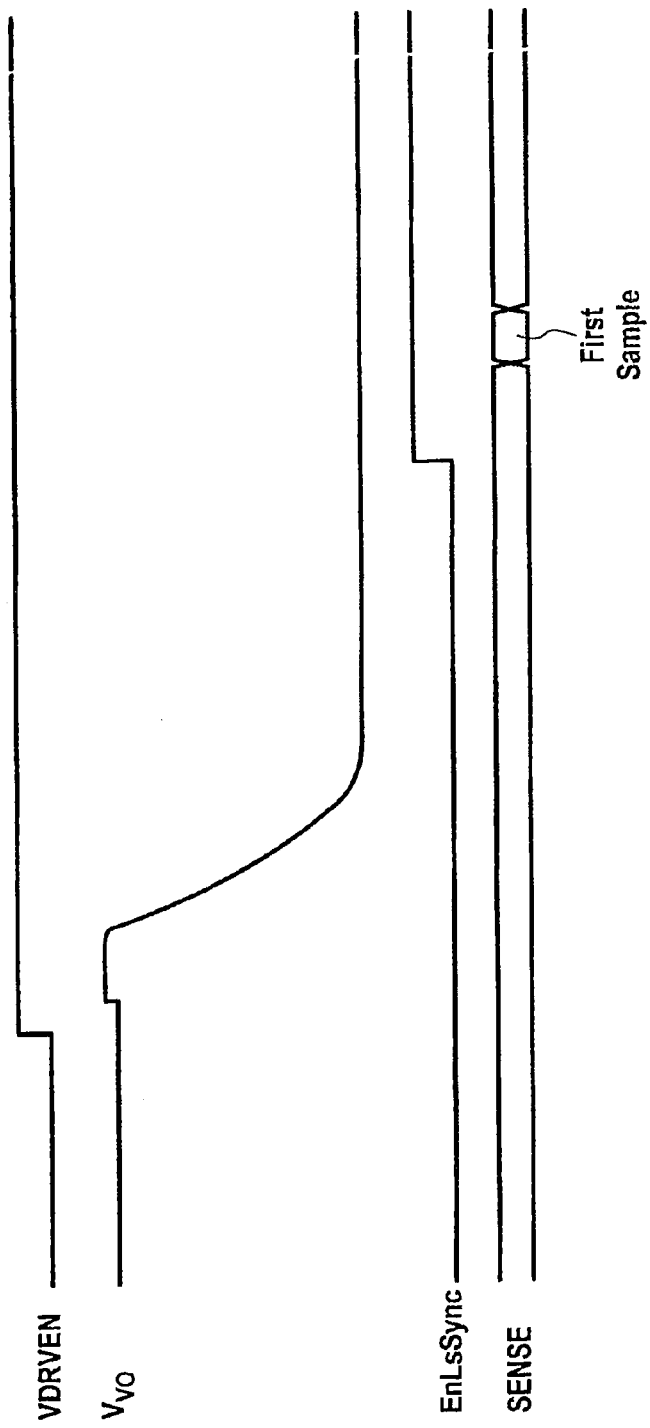
FIG. 4 shows signal profiles for a transition from recirculation phase to switched-on phase.
Figure 5:
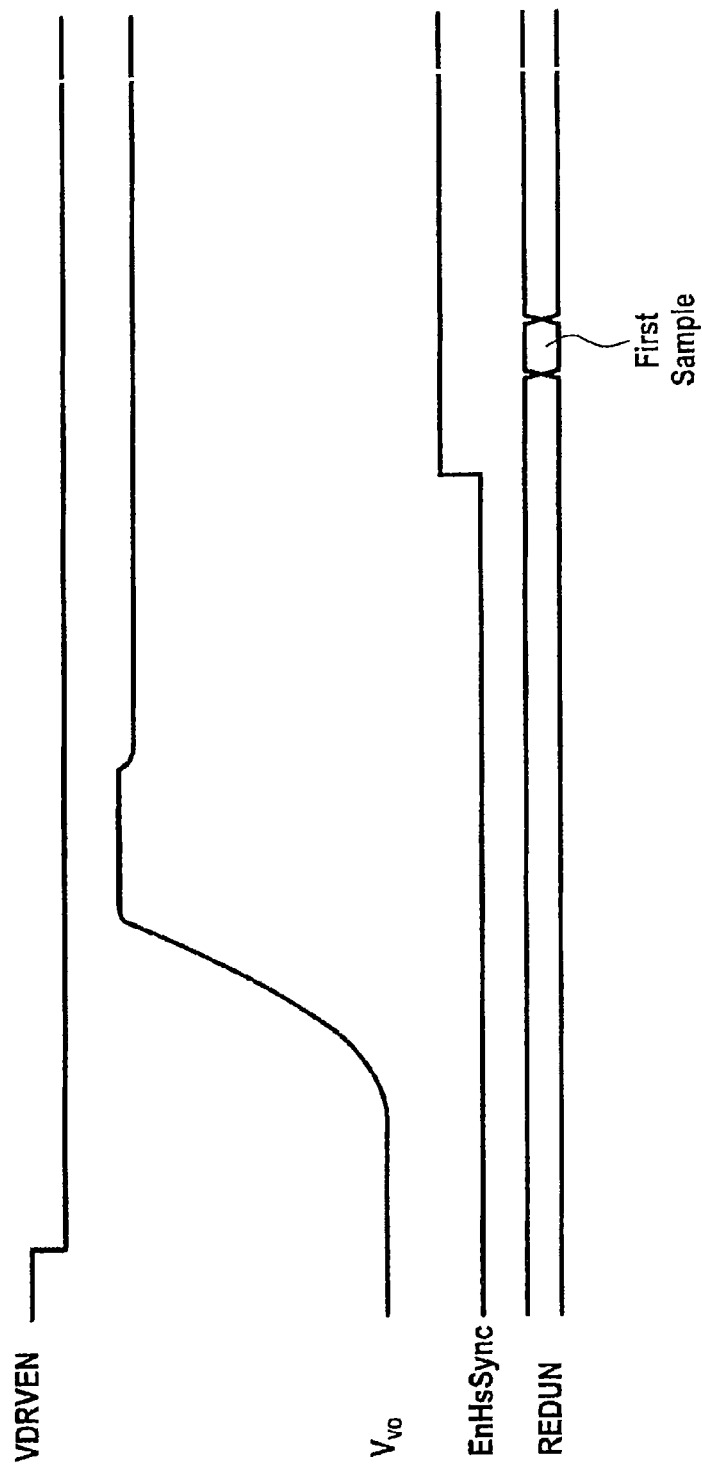
FIG. 5 shows signal profiles for a transition from switched-on phase to recirculation phase.

FIG. 4 shows exemplary signal profiles for the signals VDRVEN, $V_{VO}$, that is to say the voltage amplitude of the potential VO with respect to ground, EnLsSync and also SENSE, the meaning of which is explained with reference to FIG. 2, for a transition from the recirculation phase to the switched-on phase. The first measurement cycle of the sigma/delta modulator 13 after the beginning of the switched-on phase is illustrated by "First Sample" and occurs after closure of the output switch 122, which is actuated by the signal EnLsSync. FIG. 5 shows an example of a transition from the switched-on phase to the recirculation phase using the signal profiles VDRVEN, $V_{VO}$, EnHsSync and REDUN, which are explained with reference to FIG. 3.

Figure 6:
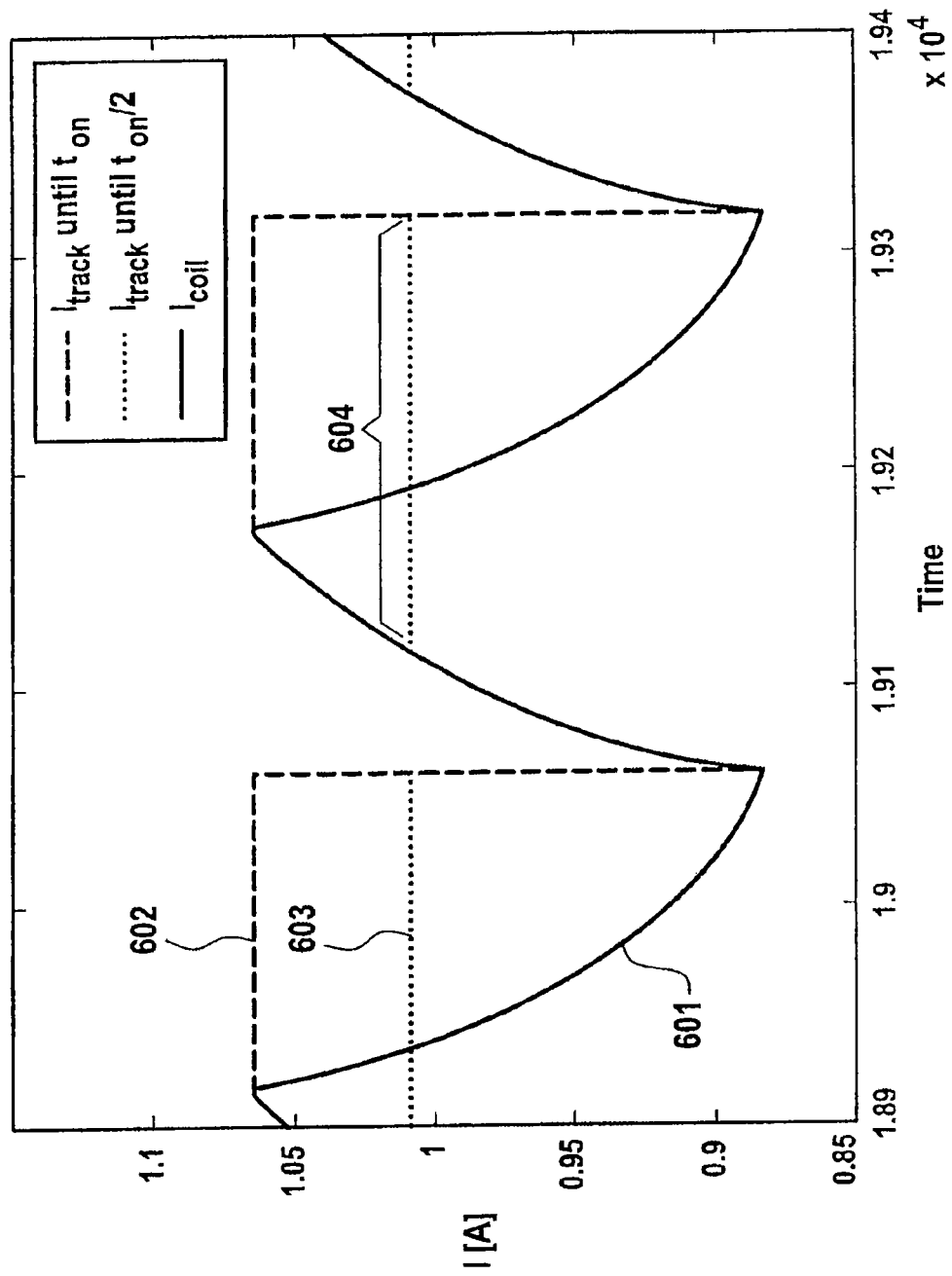
FIG. 6 shows signal profiles and current measurements with hold phases beginning during the switched-on phase.

The signal profile in FIG. 6 shows the load current 601 ($I_{coil}$) and two signal profiles 602 and 603, ascertained in different ways and representing the measurement current, from a current measurement with a hold phase. The measurement graph comes from a circuit which comprises only an actuation FET and in which the load current recirculates via an external freewheeling diode. In the case of curve 603, the hold phase 604, in which a current value is stored (flat portion of the curve), begins at a time which corresponds to approximately half of the switched-on phase ($t_{on}/2$). The hold phase of curve 602 begins only after the switched-on phase ($t_{on}$) has elapsed completely. At the beginning of a new switched-on phase, both current measurement curves jump to the initial value of the actuation current applied at this time (in FIG. 6, at approximately 0.89 A).

Figure 7:
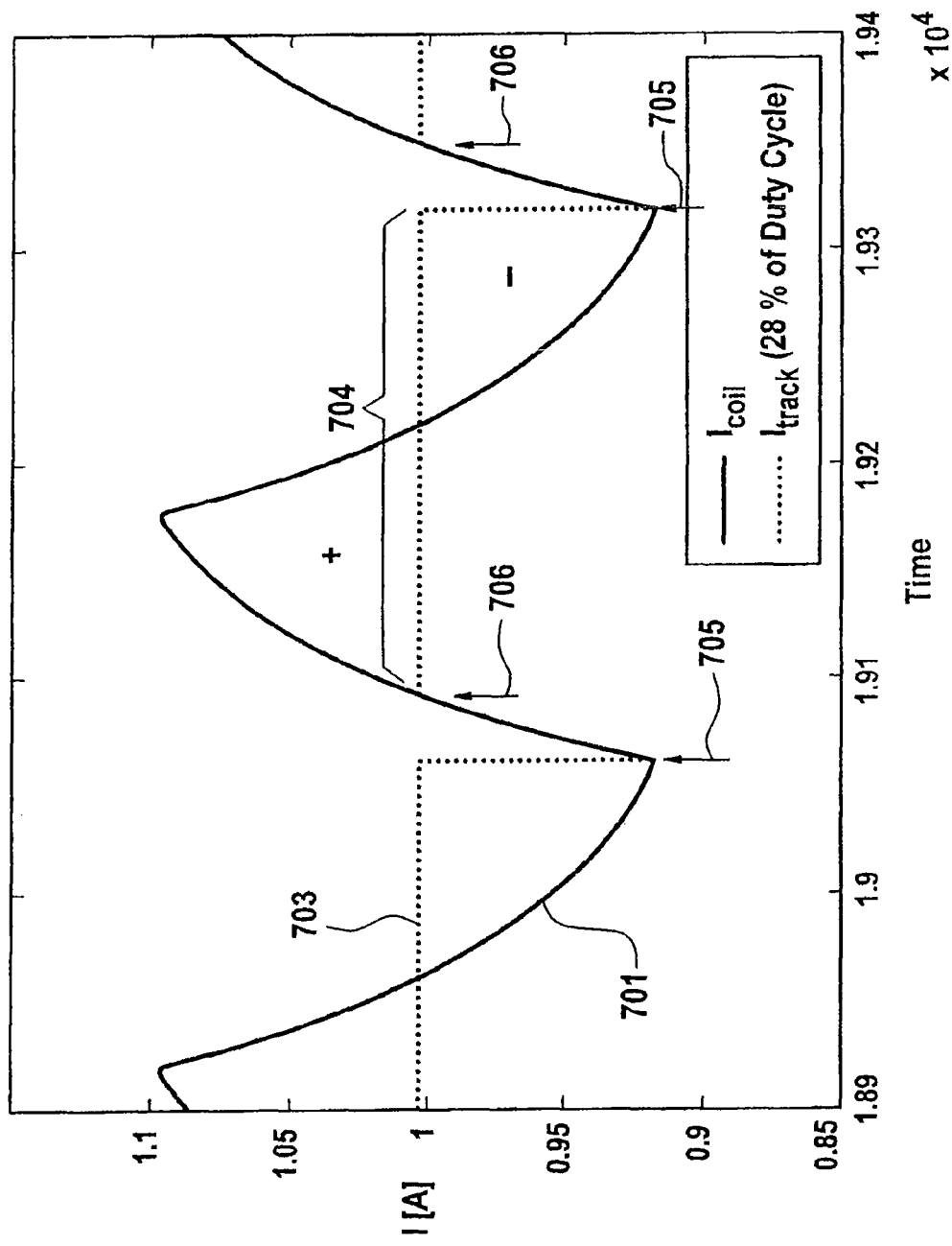
FIG. 7 shows signal profiles and current measurements with a hold phase beginning during the actuation phase given a suitable duty cycle for the PWM.

The signal profile in FIG. 7 shows the load current 701 ($I_{coil}$) and a signal profile 703 representing the measurement current when the hold phase 704, in which a current value is stored (flat portion of the curve), begins at a time which corresponds to approximately 28 percent of the duty cycle (time arrow 706). In line with FIG. 4, it ends when the actuation phase ends (arrow 705). In order to eliminate the formal error completely, it would be inherently necessary to scan the entire current profile, including the actuation and recirculation phases, as completely as possible. In a simplified circuit with only one actuation driver without a recirculation driver (for example with one or more external freewheeling diodes, which are difficult to use for current measurement), this is not readily possible, however. The method of keeping the measurement constant from a duty cycle of approximately 28 percent over a portion of the remaining actuation phase and over the entire recirculation phase results in a surprisingly high level of accuracy for the current measurement even under different loads and constraints as a result of the similarly sized integral areas (plus symbol and minus symbol in FIG. 7), which are obtained from the difference between the RMS current and the measurement current, which essentially cancel one another out. The simplified multichannel circuit in this case preferably manages with just one external measurement resistor if the actuation transistor used is a sense FET.

The invention claimed is:
1. An electronic motor vehicle control system comprising:
at least one valve actuation circuit which uses pulse width modulation (PWM) to control a load current; and
at least one electronic current measuring circuit which has at least one measurement path with at least one analog/digital converter which converts an analog measurement signal for the load current into a digital measurement signal for the load current, the at least one electronic current measuring circuit is configured to perform a plurality of current measurements per PWM period;
wherein the at least one measurement path of the current measuring circuit has a signal conservation circuit which holds the analog measurement signal for the load current essentially constant during at least a defined hold time when the actual load current is varying.

2. The electronic motor vehicle control system of claim 1, wherein the at least one analog/digital converter is in the form of a sigma/delta modulator.

3. The electronic motor vehicle control system of claim 1, wherein the at least one measurement path of the electronic current measuring circuit comprises an input circuit which has at least one sense FET which provides the analog measurement signal for the load current on the basis of the load current.

4. The electronic motor vehicle control system of claim 3, wherein the at least one sense FET is a sense amplifier.

5. The electronic motor vehicle control system of claim 3, wherein the input circuit provides the current for a switch-on path or a recirculation path for a prescribed time period which starts at the beginning of each PWM period.

6. The electronic motor vehicle control system of claim 5, wherein the current in the switch-on path is measured and forwarded from the beginning of each PWM period, and a hold phase wherein the signal conservation circuit is used begins at a prescribed time which is between some time after the beginning of the PWM period and some time before the expiry of a switched-on phase.

7. The electronic motor vehicle control system of claim 1, wherein the signal conservation circuit comprises at least one input switch and at least one output switch, wherein the input switch is configured to isolate the signal conservation circuit from the load current, and the output switch is configured to isolate the signal conservation circuit from the analog/digital converter.

8. The electronic motor vehicle control system of claim 1, wherein the at least one analog/digital converter comprises at least one memory element configured to store at least one information item about the analog measurement signal for the load current directly or indirectly, and at least one switch, wherein the at least one switch is configured to isolate the memory element.

9. The electronic motor vehicle control system of claim 8, wherein the at least one switch is configured to deactivate the analog/digital converter.

10. The electronic motor vehicle control system of claim 1, wherein the electronic current measuring circuit has at least one switch-on path and/or at least one recirculation path as measurement paths, wherein the at least one switch-on path or the at least one recirculation path comprise at least one analog/digital converter and a signal conservation circuit.

11. The electronic motor vehicle control system of claim 10, wherein the at least one switch-on path and/or the at least one recirculation path of the electronic current measuring circuit respectively comprise at least one input circuit which is/are actuated such that the input circuit produces the actual load current for said measurement path directly or indirectly only during the switched-on phase and/or the switched-off phase.

12. The electronic motor vehicle control system of claim 11, further comprising circuit means to produce the load current provision only during a portion of the switched-on and/or switched-off phase.

13. The motor vehicle control system as claimed in claim 10, wherein the electronic current measuring circuit has a changeover unit and a common averaging device, wherein outputs (SENSE, REDUN) of the switch-on path and/or of the recirculation path are connected to the inputs of the changeover unit, and the output of the changeover unit is connected to the input of the common averaging device.

14. A method for current measurement in an electronic motor vehicle control system including an electronic current measuring circuit which comprises at least one measurement path having at least one analog/digital converter, the method comprising:
controlling, by a processor of the vehicle control unit, a load current in at least one valve actuation circuit by using pulse width modulation (PWM);
converting, by the analog/digital converter, an analog measurement signal for the load current into a digital measurement signal for the load current; and
performing, by the analog/digital converter, a plurality of current measurements per PWM period;
wherein the analog measurement signal for the load current is provided in the at least one measurement path and is held essentially constant by a respective signal conservation circuit during a defined hold time when the actual load current is varying.

15. The method of claim 14, wherein the load current is measured during a switched-on phase and/or a recirculation phase of the PWM, and the electronic current measuring circuit comprises at least one switch-on path and/or at least one recirculation path as measurement paths which respectively comprise at least one analog/digital converter and a signal conservation circuit.

16. The method of claim 15, wherein the load current is determined and/or forwarded as a current measurement signal only during a portion of the switched-on and/or switched-off phase.

17. The method of claim 16, wherein a hold phase, which follows the current measuring phase and wherein a constant value is forwarded, begins at a prescribed time which is between some time after the beginning of the PWM period and some time before the expiry of the switched-on phase.

18. The method of claim 15, wherein the measurement or forwarding of the actually measured current starts at the beginning of each PWM period.

19. The method of claim 14, wherein a changeover between the PWM phases involves an input switch of the signal conservation circuit of the measurement path which is associated with the PWM phase just finished being opened, as a result of which the analog measurement signal for the load current in this PWM path is produced in unaltered form for the defined hold time ($t_{off \to on}$, $t_{on \to off}$), wherein this defined hold time is followed by an opening of an output switch of the signal conservation circuit and storing the analog measurement signal or an electrical variable, which is dependent thereon, directly or indirectly for the duration of the PWM phase just begun plus the hold time which follows this PWM phase.

20. The method of claim 19, wherein the respective changeover between the PWM phases involves, directly at the start of a respective PWM phase, closing the input switch of the signal conservation circuit of the respective PWM path and closing the output switch of this signal conservation circuit of the one PWM path respectively when the output switch of the signal conservation circuit of the other PWM path is opened.

21. The method of claim 19, wherein at the same time as the opening of the output switch of the signal conservation circuit of one of the measurement paths, a switch of the analog/digital converter of this measurement path is likewise opened and a memory element of the analog/digital converter is isolated wherein the switch of this analog/digital converter is also closed again or becomes additionally actuatable again at the same time as the output switch of the signal conservation circuit of the measurement path.

22. The method of claim 21, wherein at the same time as the opening of the output switch of the signal conservation circuit of one of the measurement paths, a switch of the analog/ digital converter of this measurement path is likewise opened the analog/digital converter is deactivated.

23. The method of claim 19, further comprising transmitting the digital measurement signals for the PWM paths to a common evaluation circuit or are taken into account by the common evaluation circuit within the time interval in which the output switch of the signal conservation circuit of the respective PWM path is closed, wherein the output signal from the common evaluation circuit contains at least the information about the amplitude of the measured load current.

24. The method of claim 23, wherein the output signal from the common evaluation circuit contains at least the information about the amplitude of the measured load current for a respective PWM period.

* * * * *

UNITED STATES PATENT AND TRADEMARK OFFICE
CERTIFICATE OF CORRECTION

PATENT NO. : 8,664,936 B2  
APPLICATION NO. : 12/934350  
DATED : March 4, 2014  
INVENTOR(S) : Oehler et al.

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 771 days.

Signed and Sealed this

Twenty-ninth Day of September, 2015

Michelle K. Lee
*Director of the United States Patent and Trademark Office*